United States Patent [19]
Arendt et al.

[11] Patent Number: 5,057,488
[45] Date of Patent: Oct. 15, 1991

[54] SYNTHESIS OF BI-PB-CA-SR-CU-O SUPERCONDUCTIVE MATERIAL

[75] Inventors: Ronald H. Arendt, Schenectady; Mary F. Garbauskas, Clifton Park, both of N.Y.

[73] Assignee: General Electric Company, Schenectady, N.Y.

[21] Appl. No.: 478,393

[22] Filed: Feb. 12, 1990

[51] Int. Cl.$^5$ .................. C01F 11/02; C01G 3/02; C01G 21/02; C01G 29/00
[52] U.S. Cl. .................. 505/1; 252/521; 423/87; 423/604; 423/617; 423/618; 501/123; 505/782
[58] Field of Search ............... 505/783, 782, 1; 252/521; 423/87, 604, 617, 618, 635; 501/123

[56] References Cited

U.S. PATENT DOCUMENTS

| 3,355,282 | 11/1967 | Kudo | 252/518 |
| 4,880,771 | 11/1989 | Cava et al. | 505/1 |
| 4,942,152 | 7/1990 | Itozaki | 505/782 |

FOREIGN PATENT DOCUMENTS

| 0008077 | 9/1989 | Japan | 505/782 |
| 0308803 | 12/1989 | Japan | 505/782 |

OTHER PUBLICATIONS

Liu, "Resistive, Magnetic, and Structural Studies of $Tl_{0.5}Pb_{0.5}$ ... ", *Appl. Phys. Lett.*, v. 55 (199), Nov. 6, 1989, pp. 2029-2031.
Rao, "Investigation of Superconducting Bismuth Cuprates ... ", *Phase Transistions*, vol. 19, Dec. 1989, pp. 201∝211.
Weber, "Processing Relationsihps in $YBa_2Cu_3O_7$ Superconductors", *Mat. Res. Soc. Symp. Proc*, vol. 99, Nov. 1987, pp. 627-630.
Durny, "Absorption Component of the Magnetic Susceptibility ... ", *Mat. Res. Soc. Symp. Proc.*, vol. 99, Nov. 1987, pp. 849-852.

*Primary Examiner*—Paul Lieberman
*Assistant Examiner*—John Boyd
*Attorney, Agent, or Firm*—James Magee, Jr.; James C. Davis, Jr.

[57] ABSTRACT

A reactant particulate mixture comprised of $Bi_2CaSr_2Cu_2O_{8\pm x}$ where x ranges from 0 to 0.5, $Ca_2CuO_3$, cupric oxide and lead oxide is formulated and reacted to produce superconductive $Bi_{2-y}Pb_yCa_2Sr_2Cu_3O_{10\pm z}$ where y ranges from 0.1 to 0.5 and z ranges from zero to less than 1.

3 Claims, No Drawings

SYNTHESIS OF BI-PB-CA-SR-CU-O SUPERCONDUCTIVE MATERIAL

U.S. Ser. No. 07/399,197 filed Aug. 28, 1989, for R. H. Arendt for "Synthesis of Bi-Ca-Sr-Cu-O Superconductive Material", is assigned to the assignee hereof and incorporated herein by reference.

The present invention relates to the preparation of oxide superconductive materials in the system bismuth-lead-calcium-strontium-copper-oxygen. Specifically, the present invention is directed to a process for producing the superconductive composition $Bi_{2-y}Pb_yCa_2Sr_2Cu_3O_{10\pm z}$ where y ranges from 0.1 to 0.5, preferably from 0.25 to 0.35, and most preferably it is 0.3, and z ranges from zero to less than 1. This composition also is referred to herein as (2223).

The conventional preparation of these superconductive materials is either the solid-state reaction of an intimate mixture of the individual particulate oxides of bismuth, lead, calcium, strontium and copper, or the compounds which yield them on heating, or the co-precipitation of the cations in intimate mixture as some salt that yields the oxides on subsequent heating to facilitate compound formation. Both processes are, in fact, controlled by solid-state transport, the first being over far greater distances than the latter. This transport mechanism is relatively slow generally requiring about 200 hours or longer. Also, as a practical matter, complete reaction cannot be achieved and the resulting reaction product generally contains (2223) in an amount of less than 90% by weight of the product. The second procedure has the added penalty of requiring the processing of large volumes of aqueous solutions, which greatly increases the cost of preparing large quantities of material.

The present invention significantly increases the yield of the (2223) composition by utilizing as a reactant, superconductive $Bi_2CaSr_2Cu_2O_{8+x}$ where x ranges from 0 to 0.5. This superconductive reactant also is referred to herein as (2122).

Briefly stated, the present process for producing a solid superconductive material containing superconductive $Bi_{2-y}Pb_yCa_2Sr_2Cu_3O_{10\pm z}$ composition where y ranges from 0.1 to 0.5 and z is less than 1 in an amount of at least 90% by weight of the material comprises providing a particulate mixture of reactants comprised of $Bi_2CaSr_2Cu_2O_{8\pm x}$ where x ranges from 0 to 0.5, $Ca_2CuO_3$, cupric oxide, and lead oxide, said mixture of reactants being formulated to produce said superconductive composition and to provide an excess amount of said $Ca_2CuO_3$ and cupric oxide sufficient to drive the reaction to produce said superconductive composition in said superconductive material, said $Ca_2CuO_3$ and cupric oxide in said mixture being present in substantially mole equivalents to each other, heating said mixture in an oxidizing atmosphere at a reaction temperature ranging from 820° C. to 860° C. to produce a reaction product wherein said superconductive composition comprises at least 90% by weight of said product, said reaction temperature being below the temperature at which sufficient liquid forms to prevent production of said reaction product, cooling said reaction product in an oxidizing atmosphere producing said solid superconductive material, and comminuting said superconductive material to produce superconductive powder.

In carrying out the present process, a superconductive powder comprised of the reactant $Bi_2CaSr_2Cu_2O_{8\pm x}$ where x ranges from 0 to 0.5, i.e. (2122), is used. Preferably, x has a value of 0. The (2122) powder should contain (2122) in an amount of at least 90% by weight of the powder and all other components which may be present in the (2122) powder should have no significant deleterious effect on the present process. Preferably, the (2122) powder contains (2122) in an amount greater than 95%, or greater than 98%, by weight of the powder. More preferably, the (2122) powder is phase pure (2122) according to X-ray diffraction analysis.

Preferably, the (2122) powder has a zero resistance transition temperature, i.e. a temperature at which there is no electrical resistance, greater than about 70K, and preferably it is about 80K.

(2122) material can be produced in a known manner by solid state reaction, i.e. firing an intimate mixture of the constituent oxides in an oxidizing atmosphere, for example, air, and cooling the reaction product in an oxidizing atmosphere. However, it is difficult to produce a powder containing (2122) in an amount greater than 90% to 95% by weight of the powder by solid state reaction.

Preferably, the (2122) material is produced according to U.S. Ser. No. 07/399,197 which discloses a process for producing a sinterable superconductive powder comprised of a composition represented by the formula $Bi_2CaSr_2Cu_2O_x$ where x ranges from about 7.5 to about 8.5, which comprises providing a first mixture of calcium carbonate, strontium carbonate and copper oxide, firing said first mixture in air at a temperature at which no liquid forms until said carbonates decompose leaving no significant amount thereof resulting in a substantially combined Ca-Sr-Cu-oxide product, forming a second mixture comprised of said oxide product, bismuth sesquioxide and an alkali chloride solvent, said Ca-Sr-Cu-oxide product and bismuth sesquioxide being formulated to produce said superconductive composition, said alkali chloride solvent being selected from the group consisting of sodium chloride, potassium chloride and combinations thereof, heating said second mixture to a reaction temperature at least sufficient to melt said chloride solvent, maintaining said reaction temperature continuously dissolving said oxide product and bismuth sesquioxide in the resulting molten chloride solvent and continuously reacting the oxides dissolved in said molten chloride solvent thereby precipitating a material of said superconductive composition, said alkali chloride solvent being present in an amount at least sufficient to carry out the production of said superconductive material, cooling the resulting reacted mass to solidify the molten chloride, adding water to the resulting solidified mass dissolving the alkali chloride, recovering said precipitated superconductive material, and comminuting said superconductive material to produce a powder.

The (2122) material produced according to U.S. Ser. No. 07/399,197 generally contains (2122) in an amount greater than 98% by weight of the material, and usually, it is phase pure (2122) according to X-ray diffraction analysis.

(2223) material cannot be produced according to the process disclosed in U.S. Ser. No. 07/399,197.

Preferably, before it is admixed with the other reactants, the (2122) material is comminuted to produce a powder of desired size, determined empirically, which enables the present reaction to be carried out. Preferably, the (2122) powder has an average particle size ranging in its longest dimension up to 10 microns, and more preferably it is less than 2 microns. Conventional comminuting techniques can be used which have no significant deleterious effect on the resulting powder.

In the present process, an oxide product comprised of a mixture of $Ca_2CuO_3$ and CuO is used to form the mixture of reactants. Generally, this oxide product is comprised of a substantially uniform, or uniform, i.e. intimate, mixture of $Ca_2CuO_3$ and CuO.

Generally, to produce the oxide product, a particulate mixture of calcium carbonate and copper oxide initially is formed which preferably is uniform or substantially uniform. The mixture is of a size, determined empirically, which enables production of the oxide product, and frequently ranges in size from submicron to 20 microns, preferably having an average particle size which is submicron. The mixture can be produced by conventional techniques which have no significant deleterious effect on the components. Preferably, the components are wet milled at room temperature in distilled water, preferably with zirconia milling media, and then dried in air. Generally, the mixture is formulated to produce mole equivalents, or substantially mole equivalents, of calcium oxide and cupric oxide. The resulting mixture is fired in air at about atmospheric pressure at a temperature at least sufficient to decompose the carbonate but not so high as to form a significant amount of liquid. A significant amount of liquid would separate the components in areas of the mixture resulting in a significantly non-uniform product. Generally, firing temperature ranges from greater than about 850° C. to less than about 950° C., and preferably it is about 925° C. Firing is carried out at least until no significant amount of the carbonate remains. In this firing, any cuprous oxide forms cupric oxide and the carbonate decomposes to calcium oxide and reacts with cupric oxide to form the oxide product comprised of a mixture of $Ca_2CuO_3$ and CuO. The oxide product is cooled in air at about atmospheric pressure, and preferably, it is furnace cooled to room temperature. In the oxide product, $Ca_2CuO_3$ and CuO are present in mole equivalents, or substantially mole equivalents, to each other. Generally, the oxide product contains no significant amount of, and preferably it is free of, calcium oxide and cuprous oxide. The reaction is as follows:

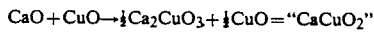

The oxide product is friable, and preferably, before it is mixed with the other reactants, it is lightly dry ground in a conventional manner, for example, by mortar and pestle, to produce a flowable powder, generally about 40 mesh (U.S. Screen Size).

Generally, lead oxide powder is used and is satisfactory in the particle size range in which it is available commercially, which ranges in average particle size from submicron to 10 microns.

In carrying out the present process, a particulate mixture of the reactants comprised of the (2122) material, $Ca_2CuO_3$, cupric oxide and lead oxide is provided. The reactants are used in amounts which will produce the superconductive (2223) powder of desired composition in the present process and such amounts are determined empirically. Specifically, the mixture of reactants is formulated to produce (2223) and to include an excess amount of the oxide product comprised of the mixture of $Ca_2CuO_3$ and CuO, or for convenience also referred to herein as "$CaCuO_2$". The excess amount of "$CaCuO_2$" should be sufficient to convert (2122) to the required amount of (2223) in the present process. Such excess amount of the "$CaCuO_2$" is determined empirically and depends largely on the fineness of the reactants. The finer the reactants, the greater is the contact therebetween and the less is the excess amount of "$CaCuO_2$" required to drive the reaction to form (2223). The reaction is as follows:

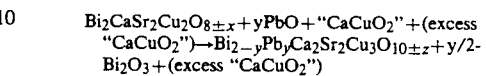

Generally, from 1.1 to 1.75 moles of total "$CaCuO_2$" is used per mole of (2122) in the mixture of reactants.

Generally, the amount of lead oxide depends largely on the particular amount of Pb desired in (2223).

The reactants are admixed to produce a particulate mixture which is sufficiently uniform and is of a sufficiently fine size to carry out the reaction to produce the present superconductive (2223) material. Preferably, the reactants are admixed to produce as intimate a mixture as possible without significant contamination to insure good contact.

Conventional mixing and comminuting techniques can be used which have no significant deleterious effect on the components and do not introduce undesirable impurities into the resulting product.

In one embodiment, the mixture of reactants is dry milled, i.e. preferably with zirconia media, in a dry atmosphere such as nitrogen.

In a preferred mixing and comminuting embodiment, the reactants are wet milled and the resulting slurry is dried in a dry gas. Preferably, the reactants are milled in an organic liquid in which they are inert or substantially inert, i.e. with which they do not react. Preferably, the organic liquid is non-aqueous or contains no significant amount of water. Also, preferably, the organic liquid has a boiling point of less than 100° C., and preferably it is heptane. Preferably, milling is carried out at about room temperature and zirconia milling media is used. The resulting mixture can be collected in a conventional manner which has no significant deleterious effect thereon. Preferably, the slurry is dried and is separated from the milling media. Preferably, the slurry is dried in a dry gas with which it does not react, or does not react to any significant extent. Conveniently, the dry gas is nitrogen, air, or mixtures thereof. By a dry gas herein, it is meant a gas containing 100 parts per million of water or less. Drying can be carried out at about atmospheric pressure or under a partial vacuum. Preferably, drying is carried out at a temperature ranging from about 50° C. to about 70° C.

In the resulting particulate mixture of reactants, the (2122) powder preferably has an average particle size ranging in its longest dimension to less than 10 microns, or preferably it is less than 2 microns, and the remaining reactants preferably have an average particle size which is submicron.

The particulate mixture of reactants is reacted to produce the present reaction product. The mixture is reacted in an oxidizing atmosphere generally at a temperature ranging from about 820° C. to 860° C., or from 820° C. to 840° C. and preferably it is 835° C. The reaction temperature should be below the temperature at which a sufficient amount of liquid forms that segregates the reactants sufficiently to prevent production of the present (2223) material. The particular reaction temperature is determined empirically and depends largely on the composition of the reactants, i.e. the composition being fired.

Reaction time is determined empirically, i.e. it should be sufficient to enable the production of the present reaction product containing (2223) in an amount of at least 90% by weight of the product. Generally, it ranges from 100 to 200 hours.

The reaction product is cooled in an oxidizing atmosphere, generally to about room temperature, to produce the present solid superconductive (2223) material. Generally, the oxidizing atmosphere, i.e., the atmosphere for carrying out the reaction as well as for cooling the reaction product, is comprised of at least about 1% by volume of oxygen and the remainder of the atmosphere is a gas which has no significant deleterious effect on the reaction product such as nitrogen or a noble gas such as argon or helium. Preferably, the oxidizing atmosphere is air. Generally, the oxidizing atmosphere is at about atmospheric pressure. The cooling rate of the reaction product can vary, i.e. it can be fast or slow cooled. In one embodiment, it is furnace cooled.

Generally, the superconductive (2223) material contains (2223) as aggregates comprised of clusters of smaller sized platelet crystals weekly bonded together autogeneously, i.e. such bonding is believed to be caused by Van der Waal's forces or by self-bonding, i.e. neck growth between grains.

The present superconductive (2223) material and resulting superconductive powder contain (2223) in an amount of at least 90% by weight of the material or powder, and generally, (2223) ranges from 90% to 95% by weight of the material or powder.

Generally, the present superconductive (2223) material or powder has a zero resistance transition temperature of greater than about 100K, preferably greater than about 105K, and frequently it ranges from about 105K to about 111K.

The (2223) material is comminuted to produce the present superconductive powder of desired size. The particular size, or size distribution, of the powder depends largely on its application. In one embodiment, the (2223) material is comminuted to produce a powder of sinterable size.

Conventional comminuting techniques can be used which have no significant deleterious effect on the resulting powder, i.e. which do not introduce undesirable impurities or a significant amount of contaminants.

In one embodiment, the (2223) material is dry milled, i.e. preferably with zirconia media, in a dry atmosphere such as nitrogen.

In a preferred embodiment, the (2223) material is milled in an organic liquid in which it is inert or substantially inert, i.e. with which it does not react. Preferably, the organic liquid is non-aqueous or contains no significant amount of water. Also, preferably, the organic liquid has a boiling point of less than 100° C., and preferably it is heptane. Preferably, milling is carried out at about room temperature and zirconia milling media is used. The resulting superconductive powder can be collected in a conventional manner which has no significant deleterious effect thereon. Preferably, the slurry is dried, then separated from the milling media. Preferably, the slurry is dried in a dry gas with which it does not react, or does not react to any significant extent. Conveniently, the dry gas is nitrogen, air, or mixtures thereof. Drying can be carried out at about atmospheric pressure or under a partial vacuum. Preferably, drying is carried out at a temperature ranging from about 50° C. to about 70° C. The comminuting techniques useful for the (2223) material are also useful for the (2122) material.

The present superconductive (2223) powder of sinterable size generally has an average size in its longest dimension ranging up to about 10 microns and frequently it is less than about 2 microns. Conventional ceramic processing techniques can be used to form the sinterable powder into a polycrystalline superconductive sintered body. Specifically, it may be pressed into green bodies of desired size and shape and sintered in a known manner at temperatures below its melting point, generally ranging from about 820° C. to 860° C. in air at about atmospheric pressure to produce a sintered body having an open porosity ranging from 10% to 20% by volume, and cooled rapidly in air at about atmospheric pressure preferably to room temperature. By room temperature herein it is meant a temperature ranging from 15° C. to 30° C. Generally, such sintered bodies have a zero resistance temperature higher than 100K. Such sintered bodies would be useful as superconducting devices such as, for example, a magnetic shield at low temperatures.

The invention is further illustrated by the following examples wherein the procedure was as follows unless otherwise stated.

All firing was carried out at about atmospheric pressure.

Firing was carried out in a silicon carbide resistance furnace.

EXAMPLE 1

In this example, (2122) powder was produced according to U.S. Ser. No. 07/399,197.

A particulate mixture comprised of 100.09 grams of calcium carbonate, 295.26 grams of strontium carbonate and 159.08 grams of cupric oxide was wet milled in a two liter polyethylene jar with 3200 grams of ⅜ inch diameter dense zirconia media using distilled water as the milling fluid and a few drops of an organic material sold under the trademark Triton X-100 as a dispersant for three hours at room temperature.

The resulting slurry was separated from the zirconia media and dried in air in an oven at from about 120° C. to 150° C.

The resulting powdered material had an average particle size which was submicron. It was placed in shallow, high density, high purity alumina ceramic boats to form a low bulk density powder bed roughly 1.0 to 1.5 cm in depth in each boat. Loose fitting alumina lids were placed on the boats.

The material was heated in air at about atmospheric pressure to 750° C. at a rate of 100° C. per hour to protect the alumina boats from thermal shock, then to 925° C. at a rate of 10° C. per hour. It was maintained at 925° C. for 48 hours and then furnace cooled to room temperature. X-ray diffraction analysis of the resultant product showed that the carbonates had completely decomposed to their respective oxides and that these oxides had reacted with themselves and the cupric oxide to form compounds and had also combined to form solid solutions. No appreciable amounts of the individual oxides was detected.

Two aliquots of the composition comprised of 95.10 grams of the resulting Ca-Sr-Cu-oxide product, 103.85 grams of bismuth sesquioxide and 50 grams of alkali chloride salt were dry-milled in a 500 ml polyethylene jar with 1600 grams of ⅜ inch diameter dense zirconia media for 45 minutes at room temperature. The salt was comprised of NaCl-50 mol % KCl and comprised about 20% by weight of the total amount of oxides and chloride present. The milled material was separated from the media on a Nylon screen and placed in a high density, high purity alumina boat to form a low bulk density powder bed. A loose fitting alumina lid was placed on the boat.

The material was reacted by heating it to 850° C. at a rate of 100° C. per hour, maintained at 850° C. for 44 hours, then furnace cooled to room temperature, all in air at about atmospheric pressure.

The superconductive product was in the form of crystalline aggregates intermixed with the solidified alkali chloride solvent. It was retrieved by dissolving the alkali chlorides in distilled water, assuming a salt solubility of 20 g/100 ml; a period of 30 minutes was allowed for this process. The particulate superconductor, now free of the alkali chlorides, was collected on a filter, washed at room temperature with ten 300 ml aliquots of distilled water, and, finally, two 300 ml aliquots of absolute methanol. The superconductive material was finally air dried on the filter at room temperature at atmospheric pressure.

The superconductivity of the aggregate powder was determined by a conventional technique, i.e. the AC Susceptibility Technique. This technique comprised using the powder as an active element in a L-C. resonance circuit and measuring the resonance frequency as a function of the circuit's temperature. The transition temperature is that at which there is a larger than background increase in the resonant frequency.

The powder was determined to have a zero resistance transition temperature of about 73K.

X-ray diffraction analysis of the superconductive aggregate powder showed it to be phase pure $Bi_2CaSr_2Cu_2O_x$.

From other work, it was known that x was about 8.

EXAMPLE 2

In this example, an oxide product comprised of mole equivalents of $Ca_2CuO_3$ and CuO was produced.

100.09 grams of calcium carbonate (average particle size of about 1 microns) and 79.54 grams of cupric oxide (average particle size of about 50 microns) were milled with zirconia balls in distilled water containing a few drops of an organic dispersant sold under the trademark Triton X-100 at room temperature for 2 hours. The resulting slurry was dried in air at 100° C. and the zirconia balls were then separated on a screen.

The resulting dried mixture was fired in air at 925° C. for 48 hours and furnace cooled to room temperature. The resulting product was friable and ground with mortar and pestle to a flowable powder of about 40 mesh (U.S. Screen Size).

X-ray diffraction analysis of this powder showed that is was comprised of a mixture of $Ca_2CuO_3$ and CuO. The mixture appeared uniform.

EXAMPLE 3

50.00 grams of the aggregate (2122) powder produced in Example 1, 9.54 grams of the oxide product powder produced in Example 2 (1.5 mole per mole of (2122)) and 3.77 grams of PbO powder with an average particle size of 2.0 microns (0.3 mole per mole of (2122)) were dry milled at room temperature with zirconia balls for about 0.5 hours. The resulting mixture was recovered from the zirconia balls by screening.

The resulting dry particulate mixture appeared to be comprised of an intimate uniform mixture of the reactants.

About a 3 mm thick substantially uniform layer of the dry mixture was placed in a gold foil boat, fired in air at 840° C. for 103 hours, and quenched in air to room temperature. The resulting product was a very friable product. It was easily comminuted with a mortar and pestle.

The resulting dry powder was a mostly platey powder which ranged in size from submicron to 100 microns or more in its longest dimension.

X-ray diffraction analysis of the powder showed that it contained the phase $Bi_{1.7}Pb_{0.3}Ca_2Sr_2Cu_3O_{10\pm z}$ in an amount of about 95% by weight of the powder. From other work, it was known that z in this phase was very nearly equal to zero.

The superconductivity of the resulting powder was determined by a conventional technique, i.e. the AC Susceptibility Technique. This technique comprised using the powder as an active element in a L-C resonance circuit and measuring the resonance frequency as a function of the circuit's temperature. The transition temperature is that at which there is a larger than background increase in the resonant frequency.

The powder was determined to have a zero resistance transition temperature of about 107.5K.

EXAMPLE 4

This is a paper example.

The superconductive powder produced in Example 3 is compressed into a compact in a conventional manner.

The compact is sintered in air at 840° C. for 50 hours, quenched in air to room temperature, repressed at room temperature to increase its bulk density, again sintered in air at 840° C. for 50 hours, quenched in air to room temperature, repressed, then sintered in air at 840° C. for 100 hours and quenched in air to room temperature. Throughout the process, the air is at about atmospheric pressure.

The resulting sintered body has a zero resistance transition temperature of 105K and an open porosity of 20%.

What is claimed is:

1. A process for producing a solid superconductive material in powder form containing superconductive $Bi_{2-y}Pb_yCa_2Sr_2Cu_3O_{10\pm z}$ phase, in which y ranges from 0.1 to 0.5 and z ranges from zero to less than 1, which comprises providing a particulate mixture of reactants consisting essentially of $Bi_2CaSr_2Cu_2O_{8\pm y}$, x being between zero and 0.5, $Ca_2CuO_3$, cupric oxide, and lead oxide, in proportions for forming said superconductive phase, the $Ca_2CuO_3$ and cupric oxide in said mixture being present in approximately equal molar amounts; heating the mixture in an oxidizing atmosphere at a temperature ranging from about 820° C. to about 860° C. to form a reaction product comprising superconductive phase; cooling the reaction product in an oxidizing atmosphere; and comminuting the reaction product to produce powder.

2. The process according to claim 1 in which the oxidizing atmosphere is air.

3. The process according to claim 2 wherein the superconductive phase constitutes at least about 90 weight percent of the reaction product.

* * * * *